United States Patent [19]
Lee et al.

[11] 4,428,807
[45] Jan. 31, 1984

[54] COMPOSITION CONTAINING POLYMERIZABLE ENTITIES HAVING OXIRANE GROUPS AND TERMINAL OLEFINIC UNSATURATION IN COMBINATION WITH FREE-RADICAL AND CATIONIC PHOTOPOLYMERIZATIONS MEANS

[75] Inventors: George A. Lee, Wayland, Mass.; Richard A. Hickner, Lake Jackson, Tex.

[73] Assignee: The Dow Chemical Company, Midland, Mich.

[21] Appl. No.: 921,011

[22] Filed: Jun. 30, 1978

[51] Int. Cl.$^3$ ............................ C08F 2/50; C08F 4/32
[52] U.S. Cl. .......................... 204/159.14; 204/159.11; 204/159.18; 204/159.23; 204/159.24; 427/54.1; 430/916
[58] Field of Search ...................... 204/159.11, 159.18, 204/159.19, 159.23, 159.24; 96/115 P, 115 R; 427/54

[56] References Cited

U.S. PATENT DOCUMENTS

| | | | |
|---|---|---|---|
| 3,753,755 | 8/1973 | Olson | 117/3.1 |
| 4,010,088 | 3/1977 | Okubo et al. | 204/159.24 |
| 4,025,407 | 5/1977 | Chang et al. | 204/159.14 |
| 4,026,705 | 5/1977 | Crivello et al. | 96/27 R |
| 4,069,054 | 1/1978 | Smith | 96/115 P |
| 4,108,747 | 8/1978 | Crivello | 204/159.18 |
| 4,156,035 | 5/1979 | Tsao et al. | 427/44 |

Primary Examiner—Wilbert J. Briggs, Sr.

[57] ABSTRACT

Photocurable resin compositions result from a mixture of polymerizable entities containing both terminal olefinic unsaturation and oxirane groups and a bifunctional curing system capable of initiating free radical and cationic polymerization.

36 Claims, No Drawings

COMPOSITION CONTAINING POLYMERIZABLE ENTITIES HAVING OXIRANE GROUPS AND TERMINAL OLEFINIC UNSATURATION IN COMBINATION WITH FREE-RADICAL AND CATIONIC PHOTOPOLYMERIZATIONS MEANS

BACKGROUND OF THE INVENTION

The prior known coating processes have conventionally been carried out by dissolving film-forming materials in a volatile solvent, applying the solution to a substrate and drying and curing the coating with the release of the solvent. Commonly, heat is applied to accelerate the film formation. The release of the solvent frequently leaves pinholes in the resulting coating. Also, the release of such solvents into the atmosphere is environmentally unacceptable.

More recently, solvent-free prepolymers such as epoxy resins and modified epoxy resins such as acrylic esters of polyepoxides, have been developed. Many of such formulations employ reactive diluents to adjust the viscosity of the composition to that suitable for casting or other fabrication techniques. Also, many of those compositions are photocurable which further minimizes the evolution of solvents. However, when those materials, such as the epoxyesters, are cured by ultraviolet light using the known photoinitiators and photosensitizers, the coatings are found to have unacceptable adhesion to metallic substrates such as aluminum. Adequate adhesion is attained in some cases only with a post thermal bake at elevated temperatures. In many cases even such a post cure is not sufficient to cause adhesion. Such a step is undesirably costly, tends to defeat the purpose of preventing loss of volatiles to the atmosphere and requires a high energy input. In addition, many of these systems tend to be air inhibited which may result in tacky surfaces or require extra cure time to produce a surface free of tack.

Radiation curable epoxy resins have been described which can provide excellent adhesion to metals. These systems suffer from a number of disadvantages, however. They cannot be readily cured in films greater than approximately 0.1 to 0.3 mil without wrinkling of the coating. Thicker coatings may appear cured but removal of the thin skin on top will reveal uncured resin underneath. An additional problem is frequently encountered with pure epoxy systems, especially those based exclusively on bisphenol diglycidyl ethers or epoxidized cycloolefins. Typically these products exhibit excessive brittleness which results in a low reverse impact on metal panels.

It would be desirable to have a coating formulation that is curable by ultraviolet light that retains the properties of prior known coatings and also exhibits improved adhesion to nonporous substrates such as metals and without the air inhibition exhibited by many conventional unsaturated ultraviolet curable compositions. It would also be desirable to obtain the useful properties of photocurable epoxies.

SUMMARY OF THE INVENTION

This invention is a photocurable resin composition exhibiting improved properties over known photocurable acrylic compositions or epoxy compositions. That result is achieved by using a curing system consisting essentially of a free radical photoinitiator and a radiation sensitive cationic polymerization catalyst precursor in conjunction with polymerizable entities having both terminal olefinic unsaturation and oxirane groups. These polymerizable entities may contain the terminal unsaturation and oxirane groups within the same molecule, hereinafter referred to as epoxyester. Also useful are mixtures or alloys of separate products, containing terminal unsaturation and oxirane groups respectively, can be used.

Any of the known polyepoxides can be employed in the preparation of the epoxyester resins or the alloys. Useful polyepoxides are glycidyl polyethers of both polyhydric alcohols and polyhydric phenols, epoxy novolacs, epoxidized esters of fatty acids or drying oils, epoxidized polyolefins, epoxidized di-unsaturated acid esters, epoxidized unsaturated polyesters and mixtures thereof so long as they contain more than one epoxide group per molecule on an average. The polyepoxides may be monomeric or polymeric.

Within the scope of this invention, a number of polyepoxide modifications can be readily made. It is possible to increase the molecular weight of the polyepoxide by polyfunctional reactants which react with the epoxide group and serve to link two or more polyepoxide molecules. A dicarboxylic acid, for example, can be reacted with a diepoxide, such as the diglycidyl ether of a bisphenol, in such a manner so as to join two or more diepoxide molecules and still retain terminal epoxide groups. Other polyfunctional reactants include diisocyanates, dicarboxylic acid anhydrides and those reactants which contain functional groups which will react with the epoxide group. Also, the polyepoxide may contain bromine or other substituents on the molecule, particularly substituted on the aryl group of a polyhydric phenol used in making the polyepoxide.

Where polyhydric phenols are selected to prepare the polyepoxide many structural embodiments are possible. Polyepoxides prepared from polyhydric phenols may contain the structural group:

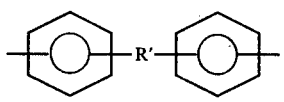

wherein R' is a divalent hydrocarbon radical such as:

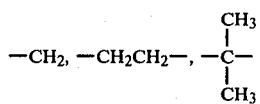

and the like or R' is:

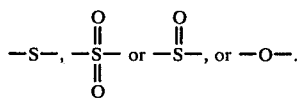

Other polyhydric phenols are the novolacs wherein phenols or substituted phenols are linked together with an alkylene group. The choice of novolac resins leads to a separate, well-recognized class of epoxy novolac resins.

Other modifications are well known to those skilled in the art.

The polyepoxides referred to as epoxidized diolefins, epoxidized esters of fatty acids, etc., are generally made by the known peracid method where the reaction is one of epoxidation of compounds with isolated double bonds at a controlled temperature so that the acid resulting from the peracid does not react with the resulting epoxide group to form ester linkages and hydroxyl groups. Preparation of polyepoxides by the peracid method is described in various periodicals and patents and such compounds as butadiene polymers, ethyl linoleate, polyunsaturated drying oils or drying oil esters can all be converted to polyepoxides.

While the invention is applicable to epoxyesters and alloys prepared from polyepoxides, generally, preferred polyepoxides are glycidyl polyethers of polyhydric alcohols or polyhydric phenols having weights per epoxide group of 150 to 2000. These polyepoxides are usually made by reacting at least about two moles of an epihalohydrin or glycerol dihalohydrin with one mole of the polyhydric alcohol or polyhydric phenol, and a sufficient amount of a caustic alkali to combine with the halogen of the halohydrin. The products are characterized by the presence of more than one epoxide group, i.e., a 1,2-epoxy equivalency greater than one. An additional preferred class of polyepoxides are epoxidized cycloolefins. These polyepoxides can be prepared by epoxidation of a cyclic olefinic material by known peracid methods. Typical examples are the following:

A diepoxide of an alkylcyloalkyl hydrocarbon is vinylcyclohexene dioxide, more specifically identified as 3-(epoxyethyl)-7-oxabicyclo[4.1.0]heptane, or 1,2-epoxy-4-(epoxyethyl)cyclohexane, having an epoxy equivalent weight of 70 and the structural formula:

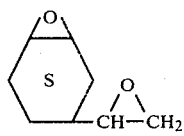

A diepoxide of a cycloalkyl hydrocarbon is dicyclopentadiene dioxide, more specifically identified as 3,4-8,9-diepoxytricyclo[5.2.1.0$^{2,6}$]decane, having an epoxy equivalent weight of 82 and the structural formula:

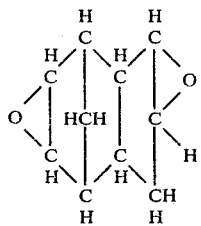

A diepoxide of a cycloalkyl ether is bis(2,3-epoxycyclopentyl)ether, otherwise named 2,2'-oxybis(6-oxabicyclo[3.1.0]hexane), having an epoxy equivalent weight of 91.

In addition to the epoxidic prepolymers discussed hereinabove, the epoxide materials include also, admixed therewith, an ester having two epoxycycloalkyl groups. Thus, a suitable ester of epoxidized cyclohexanemethanol and epoxidized cyclohexanecarboxylic acid is the diepoxide(3,4-epoxycyclohexyl)methyl 3,4-epoxycyclohexanecarboxylate; this same ester may be indexed under the name 7-oxabicyclo[4.0.1]hept-3-ylmethyl 7-oxabicyclo[4.0.1]heptane-3-carboxylate, and has the formula:

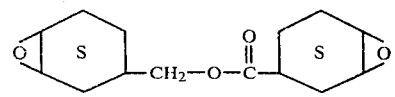

Another suitable ester having two epoxycycloalkyl groups may be obtained as an ester of an alkyl-substituted (epoxycycloalkane)methanol and a dibasic acid, for example, bis[3,4-epoxy-6-methylcyclohexyl)methyl]adipate, which may be named alternatively bis[(4-methyl-7-oxabicyclo[4.1.0]hept-3-yl)methyl]adipate, and which has the formula:

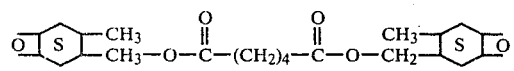

Although the presence of these cycloaliphatic polyepoxides is not essential, the presence of up to about 50 percent by weight in the polyepoxide portion of the composition may enhance cure rates and physical properties of the coatings.

Ethylenically unsaturated monocarboxylic acids suitable for reaction with the polyepoxide include the α,β-unsaturated monocarboxylic acids including, for example, acrylic acid, methacrylic acid, crotonic acid, cinnamic acid and the like.

Also useful as the unsaturated monocarboxylic acids are the hydroxyalkyl acrylate or methacrylate half esters of dicarboxylic acids. The hydroxyalkyl groups of the half esters preferably contain from two to six carbon atoms and include such groups as hydroxyethyl, beta-hydroxypropyl, beta-hydroxybutyl and the like. It is also intended to include those hydroxyalkyl groups in which an ether oxygen is present. The dicarboxylic acids can be either saturated or unsaturated. Saturated acids include phthalic acid, chlorendic acid, tetrabromophthalic acid, adipic acid, succinic acid, glutaric acid and the like. Unsaturated dicarboxylic acids include maleic acid, fumaric acid, citraconic acid, itaconic acid, halogenated maleic or fumaric acids, mesaconic acid and the like. Mixtures of ethylenically unsaturated carboxylic acids may be used.

To prepare an epoxyester the polyepoxide is reacted with the ethylenically unsaturated monocarboxylic acid either with or without a solvent at a temperature of 20° to 120° C. The reaction may also be conducted in the presence or absence of suitable catalysts such as alcoholates, tertiary amino phenols or others well known to the art. If an epoxyester is desired which contains both vinyl and oxirane unsaturation in the same molecule, the unsaturated acid is added in an amount sufficient to provide about 0.1 to 0.9 equivalent of unsaturated acid per equivalent of polyepoxide. The reaction is continued until the acid content (as —COOH) drops below about 0.5 percent by weight. When it is desired to make the completely esterified product to be used in an alloy or mixture of unsaturated molecules and epoxide containing molecules, the same procedure is followed but using from about 0.8 to 1.2 equivalents of epoxide per equivalent of acid. That completely esterified product may then be mixed with a polyepoxide to produce the desired polymerizable entities useful herein.

The ethylenically unsaturated monocarboxylic acid polyepoxide reaction product containing secondary hydroxyl groups may be further reacted with minor proportions of a dicarboxylic acid anhydride. The dicarboxylic acid anyhydride may be selected from either the saturated or unsaturated dicarboxylic acid anhydrides previously recited or mixtures thereof. A reaction temperature from about 25° to 150° C. is suitable, but about 80° to 120° C. is preferred. Advantageously, a suitable vinyl polymerization inhibitor such as the methyl ether of hydroquinone or hydroquinone and the like may be added.

The alloys useful herein are a blend of an epoxyester or polyepoxide as described above and an unsaturated polymerizable entity. An additional class of ethylenic unsaturated materials which may be used in the preparation of alloys include those materials prepared by reacting acrylic or methacrylic acid with a polyhydric alcohol. Examples of polyhydric alcohols include those polyols containing from two to four hydroxyl groups and containing from two to twelve carbon atoms. Examples include the reaction product of acrylic or methacrylic acid with ethylene glycol, trimethylol propane, pentaerythritol, 1,6-hexanediol and the like. Additional polyhydric alcohols would include alcohols as described above reacted with alkylene oxides such as propylene oxide or ethylene oxide or mixtures thereof. Typical examples would include 4,4-isopropylidene bisphenol reacted with four moles of ethylene oxide or glycerol reacted with propylene and ethylene oxide to an average molecular weight of 3,000.

Another class of unsaturated polymerizable entities useful in preparing alloys can be made by reacting an unsaturated oxirane such as glycidyl acrylate or methacrylate with a polycarboxylic acid. Examples of polycarboxylic acid would include adipic acid, azaleic acid, isophthalic acid, trimesic acid, and dimerized or trimerized linoleic or oleic acid known to the trade as dimer or trimer acids. Other polycarboxylic acids which can be reacted with glycidyl acrylate would include those carboxylic acid terminated polyesters prepared by reacting an excess of the above polycarboxylic acids with a polyol such as ethylene glycol, tripropylene glycol, glycerol, 1,4-butanediol, 1,6-hexanediol and the like.

The alloys are prepared by blending in known manner one or more of the polyepoxides and the fully or partially esterified polyepoxide or other unsaturated polymerizable entity in proportions to provide the desired ratio of unsaturation and oxirane groups. For use in printing ink and coating formulations, the epoxyester resin or the alloy of polymerizable entities is commonly blended with a reactive diluent which is usually an ethylenically unsaturated monomer that is copolymerizable with the polymerizable entities.

A wide selection of polymerizable monomers containing the >C=CH$_2$ group is available from the many known classes of vinyl monomers. Representative species include styrene, vinyl toluene, and the butyl, 2-ethylhexyl, phenoxyethyl, dicyclopentenyl, tetrahydrofurfurylmethyl, and benzyl esters of acrylic or methacrylic acid, vinyl acetate, diallyl maleate, dimethallyl fumarate, acidic monomers such as acrylic acid, methacrylic acid, acrylamide or vinyl carboxylic acids prepared by reacting a hydroxyalkyl acrylate such as 2-hydroxyethyl acrylate with an anhydride such as phthalic anhydride.

Preferred polymerizable monomers containing the >C=CH$_2$ group are acrylic, methacrylic esters which include both the saturated alcohol esters and the hydroxyalkyl esters. Within this group, acrylic esters are the most preferred.

The epoxyester or alloy composition may consist of up to 70 percent by weight of polymerizable entities with the balance of the combined weight consisting of reactive diluent. Preferably, the polymerizable portion of the composition consists of 30-60 percent by weight of said diluent and 70-40 percent by weight of said polymerizable entity.

While it is preferred in many applications to blend the epoxyester resin or alloy with a polymerizable monomer as a reactive diluent, the present invention is not limited thereto. The polymeric entity can be cured and polymerized in the absence of such a monomer and can be applied and utilized as solutions in a nonpolymerizable solvent, such as is practiced in certain coating operations.

The catalytic inducement for the photopolymerization of these compositions involves a simultaneous free radical and cationic initiation process as will be further described.

The free radical photoinitiator can be selected from any of those known acrylate photoinitiators. Included among such compounds are those from the classes of benzoin ethers, acyloin ethers, halogenated alkyl or aryl derivatives, aromatic carbonyl derivatives and other known compounds. Typical species include i-butylbenzoin ether, diethoxyacetophenone, and p-tert-butyl-α,α,α-trichloroacetophenone. Other species will be known to the skilled worker.

The ionic catalyst is a material, such as a Lewis acid, which will initiate polymerization of epoxy compounds. Since such ionic catalysts added as such could cause premature polymerization, it is most convenient to add the catalyst in the form of a precursor which under photoinducement, decomposes to form the active catalyst, as for example, the Lewis acid.

One class of photosensitive Lewis acid catalyst precursors is that of the aromatic diazonium salts of complex halogenides which decompose upon application of energy to release a halide Lewis acid.

The aromatic diazonium cation may be represented generally as [Ar—N$^+$≡N], where the aryl group Ar, which may be alkaryl hydrocarbon group, is bonded to the diazonium group by replacing one of the hydrogen atoms on a carbon atom of the aromatic nucleus, and where the aryl group ordinarily carries at least one pendant substituent for greater stability of the cation. Thus, the pendant substituent may be alkyl, or another substituent, or both. The complex halogenide anion may be represented by $[MX_{n+m}]^{-m}$. Thus, the photosensitive salt and its decomposition upon actinic irradiation may be depicted as follows:

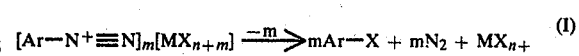

$$[Ar-N^+\equiv N]_m[MX_{n+m}] \xrightarrow{-m} mAr-X + mN_2 + MX_{n+} \quad (I)$$

where X is the halogen ligand of the complex halogenide, M is the metallic or metalloid central atom thereof, m is the net charge on the complex halogenide ion, and n is the number of halogen atoms in the halide Lewis acid compound released. The Lewis acid halide $MX_n$ is an electron pair acceptor, such as $FeCl_3$, $SnCl_4$, $PF_5$, $AsF_5$, $SbF_5$, and $BiCl_3$, which upon suitable irradiation of the diazonium complex salt is released in substantial quantities and initiates or catalyzes the polymerization process, wherein the monomeric or prepolymeric material is polymerized or cured as the result of the actinic irradiation.

The catalyst precursors in the form of photosensitive aromatic diazonium salts of complex halogenides may be prepared using procedures known in the art. Thus, for example, chlorometallic halogenide complexes may be prepared in accordance with the method set forth by Lee et al. in *Journal of the American Chemical Society*, 83, 1928 (1961).

An especially useful precursor is p-chloro-benzene diazonium hexafluorophosphate. Other species will be known in the literature such as the extensive list found at Columns 8 and 9 of U.S. Pat. No. 3,936,557.

A preferred class of useful ionic catalyst precursors are the arylhalonium salts of the formula:

$$[(R)_a(R')_bX]^+[YF_6]  \quad (II)$$

where R is a monovalent aromatic organic radical, R' is a divalent aromatic organic radical, X is a halogen radical, such as I, Br, Cl; Y is selected from a Group VA element as, for example, P, As and Sb; a is a whole number equal to 0 or 2; b is a whole number equal to 0 or 1 and the sum of a+b is equal to 2 or the valence of X.

Radicals included by R can be the same or different, aromatic carbocyclic or heterocyclic radicals having from 6 to 20 carbon atoms, which can be substituted with from 1 to 5 monovalent radicals selected from $C_{(1-8)}$ alkoxy, $C_{(1-8)}$ alkyl, nitro, chloro, etc., R is more particularly phenyl, chlorophenyl, nitrophenyl, methoxyphenyl, pyridyl, etc. Radicals included by R' are divalent radicals such as:

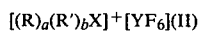

The arylhalonium salts are prepared by mixing at a temperature of from 9° to 100° C. in aqueous medium substantially equal molar amounts of an arylhalonium bisulfate salt of the formula:

$$[(R)_a(R')_bX]^+[HSO_4]^-  \quad (III)$$

and an alkali Group VA metal hexafluoro acid or salt. Such preparations are described in U.S. Pat. No. 3,981,897 and various reference cited therein by patentee.

Typical of the bisulfate salts are diphenyliodonium bisulfate, 4,4'-dichlorodiphenyliodonium bisulfate, 4,4'-dibromodiphenyliodonium bisulfate, 3,3'-dinitrodiphenyliodonium bisulfate, 4,4'-dimethyldiphenyliodonium bisulfate, 4,4'-bissuccinimidodiphenyliodonium bisulfate, 3-nitrodiphenyliodonium bisulfate, and 4,4'-dimethoxydiphenyliodonium bisulfate.

Included by the Group VA metal hexafluoride salts useful in preparing the salts of Formula II by reacting with the salts of Formula III are, for example, NaPF$_6$, NaAsF$_6$, KSbF$_6$, KAsF$_6$, Ca(PF$_6$)$_2$, Mg(AsF$_6$)$_2$, HPF$_6$, HAsF$_6$, HSbF$_6$, Ba(AsF$_6$)$_2$, Pb(PF$_6$)$_2$, Zn(AsF$_6$)$_2$, etc.

Another preferred class of onium salts are those having the general formula:

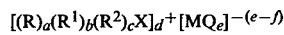

where R is a monovalent aromatic organic radical, R$^1$ is a monovalent organic aliphatic radical selected from alkyl, cycloalkyl and substituted alkyl, R$^2$ is a polyvalent organic radical forming a heterocyclic or fused ring structure selected from aliphatic radicals and aromatic radicals, X is a Group VIa element selected from sulfur, selenium and tellurium, M is a metal or metalloid, Q is a halogen radical, a is a whole number equal to 0 to 3 inclusive, b is a whole number equal to 0 to 2 inclusive, c is a whole number equal to 0 or 1, where the sum of a+b+c is a value equal to 3 or the valence of X, d = e − f f = valence of M and is an integer equal to from 2 to 7 inclusive e is >f and is an integer having a value up to 8.

Radicals included by R are, for example, $C_{(6-13)}$ aromatic hydrocarbon radicals such as phenyl, tolyl, napthyl, anthryl, and such radicals substituted with up to 1 to 4 monovalent radicals such as $C_{(1-8)}$ alkoxy, $C_{(1-8)}$ alkyl, nitro, chloro, hydroxy, etc.; arylacyl radicals such as benzyl, phenylacyl, etc.; aromatic heterocyclic radicals such as pyridyl, furfuryl, etc. R$^1$ radicals include $C_{(1-8)}$ alkyl, such as methyl, ethyl, etc., substituted alkyl such as —C$_2$H$_4$OCH$_3$, —CH$_2$COOC$_2$H$_5$, —CH$_2$COCH$_3$, etc. R$^2$ radicals include such structures as:

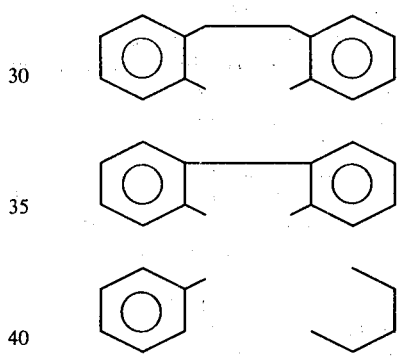

Complex anions included by MQ$_e$−(e−f) of Formula I are, for example, BF$_4$−, PF$_6$−, AsF$_6$−, SbF$_6$−, FeCl$_4$−, SnCl$_6$−, SbCl$_6$−, BiCl$_5$−, AlF$_6$−$^3$, GaCl$_4$−, InF$_4$−, TiF$_6$=, ZrF$_6$−, etc., where M is a transition metal such as Sb, Fe, Sn, Bi, Al, Ga, In, Ti, Zr, Sc, V, Cr, Mn, Cs, rare earth elements such as the lanthanides, for example, Ce, Pr, Nd, etc., actinides, such as Th, Pa, U, Np, etc., and metalloids such as B, P, As, etc.

Yet another class of onium salts are those of the Group VA elements of the general formula:

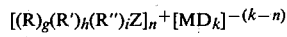

wherein the values for R, R' and R" are generally the same as described above for the onium salts; Z is a Group VA element selected from N, P, As, Sb and Bi; M is a metal or metalloid; D is a halogen radical; g is a whole number of from 0 to 4; h is a whole number of from 0 to 2; i is a whole number of from 0 to 2 and the sum of g+h+i is a value equal to 4 or the valence of Z; n is k minus the valence of M which is a number of from 2 to 7 and k is greater than the valence of M and is a number having a value up to 8.

Certain of the catalysts will function both as a free radical initiator and as an ionic catalyst precursor. Typical of these catalysts is p-tert-butyl-α,α,α-trichloroacetophenone. Also such catalyst systems as those described in U.S. Pat. No. 4,069,054 are bifunctional in this manner. Those systems are an aromatic sulfonium compound sensitized with an aromatic tertiary amine, an aromatic tertiary diamine, or an aromatic polycyclic compound, all as further defined in the patent. Those teachings are incorporated herein by reference.

Many of the ionic catalyst precursors are solids. It is usually possible to dissolve such solids in the polymerizable epoxyester and diluent. However, it is also convenient to dissolve the precursor in a small amount of solvent, such as acetonitrile, prior to addition to the epoxyester. Such technique frequently aids in the uniform distribution of the precursor throughout the epoxyester. When an unpolymerizable solvent is employed, it is desirable to keep its amount below about 4 or 5 weight percent of the composition. Preferably, the solvent is a polymerizable material, and especially preferred is the use, as such a solvent, of a small amount of any monomer to be used as a reactive diluent in the composition.

The amount of free radical photoinitiator to be employed herein may be varied between 0.1 to about 10 weight percent of the total composition. Preferably, the amount will be in the range of from 1 to 4 weight percent. The ionic catalyst precursor is useful in the range of from about 0.05 to 15 weight percent of the formulation; preferably from 0.2 to 4.0 weight percent. The optimum level for each catalytic ingredient will be easily determined by simple preliminary experiment.

The compositions can be made to be curable by exposure to visible light by the further inclusion of a small amount of certain organic dyes as photosensitizers for the free radical and ionic catalysts of this invention. Generally, those dyes which are useful are those from the classes of cationic dyes and basic dyes. The dye is usually effective in a concentration of from about 0.001 percent to about 3 percent of the binary curing system.

The compositions are readily prepared by mixing the epoxyester or the alloy with any reactive or nonreactive diluent that may be desired to achieve a desired viscosity or for other reasons. Also, any inert pigments, fillers, softeners, stabilizers or other desired additives may be blended therein. The two catalyst ingredients are then added.

The compositions are fabricated into the desired shape as, for example, by casting or otherwise applying a coating onto a substratum. After shaping, the uncured composition is exposed to a light source to cause polymerization. The light source can be any ultraviolet actinic radiation such as that produced from a mercury, xenon or carbon arc lamp. The compositions are well adapted to imaging processes, wherein parts of the uncured coating are masked and then exposed to the radiation source so that only those exposed portions are cured. The unexposed parts remain uncured and can be washed away with suitable solvents to leave a reversal image.

These compositions solve a problem exhibited by the prior known photocurable acrylate polymer formulations which did not have adequate adhesion to aluminum or tin-free steel substrates without a thermal post baking step. These compositions exhibit excellent adhesion to such substrates with only an actinic radiation cure. That adhesion is obtained without sacrificing the other superior chemical and physical properties of such systems. In addition to overcoming these problems associated with acrylic systems, the compositions of this invention overcome the difficulties associated with curing thick sections of epoxies and also overcome the surface inhibitions of acrylics.

The following examples will serve to further illustrate the present invention.

Example 1

A partially acrylated epoxy resin was prepared by heating a mixture of 0.065 mole of a diglycidyl ether of bisphenol A, 0.033 mole acrylic acid, 0.0313 gram hydroquinone and 0.0313 gram methyl ether of hydroquinone with 13 milligrams tris(dimethylaminomethyl)-phenol in 0.15 milliliter water at 90° C. for two hours followed by heating at 110° C. for one hour. The resin analyzed to contain 50 percent acrylate and 50 percent epoxide functionality.

0.4843 Gram of that resin was mixed with 0.508 gram dicyclopentadiene acrylate (DCPDA), 0.0359 gram diethoxyacetophenone and 0.0482 gram of an acetonitrile solution of p-chlorobenzene diazonium hexafluorophosphate to give 0.34 weight percent of the total mixture.

The mixture was spread onto Parker aluminum panels with a No. 7 Meyer wound wire rod. The composition was cured by passing under a 200 watt/linear inch Hanovia mercury arc lamp at a rate of 100 feet/minute. After 3 passes the coating had become tack free.

The panels were also tested for adhesion by scratching 10 straight lines across the panel and 10 lines at right angles to provide 100 squares. Strips of No. 610 Scotch brand tape were then stuck to the coating and pulled away from the coating. The number of squares without any coating removed is the percentage adhesion. When so tested, the panels showed 100 percent adhesion.

By way of contrast, 0.69 gram of the same resin was mixed with 0.61 gram DCPDA and 0.08 gram of an acetonitrile solution containing 5 milligrams of p-chlorobenzene diazonium hexafluorophosphate. The composition was cast and exposed to ultraviolet light as above. The coating did not develop a mar-free surface after more than 10 passes under the lamp.

By way of further contrast, a mixture was prepared from 0.52 gram resin, 0.52 gram DCPDA and 28.5 milligrams of diethoxyacetophenone. The mixture was applied to the panels and was cured after 7 passes under the lamp. No adhesion to Parker aluminum test panels could be obtained without a subsequent thermal post bake at about 150° C. for five minutes.

Example 2

Different ratios of the above resin and DCPDA were mixed with 3.2 percent diethoxyacetophenone and 0.33 weight percent p-chlorobenzene diazonium hexafluorophosphate added in acetonitrile solution. All samples were cast onto untreated Parker aluminum panels as above and cured by passage under a single 200 watt/linear inch Hanovia mercury arc lamp at a rate of 100 feet/minute. The samples were tested for adhesion using the previously described cross-hatch test. The results are listed in the following table:

| Parts Resin | Parts DCPDA | Number of Passes to Cure | % Adhesion |
|---|---|---|---|
| 38 | 55 | ¾ | 100 |
| 54 | 39 | 4/5 | 100 |

-continued

| Parts Resin | Parts DCPDA | Number of Passes to Cure | % Adhesion |
|---|---|---|---|
| 65 | 27 | 5 | 100 |

The number of passes to cure was that number required for the sample to develop a mar-free surface.

Example 3

The resin of Example 1 was blended in a 1 to 1 ratio with various diluents. There was then added 2.9 percent diethoxyacetophenone and 0.29 percent p-chlorobenzene diazonium hexafluorophosphate.

The compositions were cast as above on untreated Parker aluminum panels and cured as in the previous examples. Adhesion was determined by the previously described cross-hatch test. The results are listed below:

| Diluent | Number of Passes to Cure | % Adhesion |
|---|---|---|
| 2-Chloroethyl acrylate | ⅔ | 98 |
| N—vinylpyrrolidone | 6/7 | 10 |
| Tetrahydrofurfuryl acrylate | ⅔ | 60 |
| 2-Methoxyethyl acrylate | ¾ | 97 |
| DCPDA | 4/5 | 100 |
| Tetrahydrodicyclopentadiene acrylate | 5/6 | 100 |

Example 4

A composition was prepared by blending an acrylic interpolymer mixture with a mixture of polyepoxides. The acrylic interpolymer was a mixture of 47 weight percent of the diacrylate of a diglycidyl ether of bisphenol A extended to an epoxy equivalent weight (EEW) of 650 with bisphenol A plus 25.5 percent n-butyl acrylate plus 27.5 percent of 2-phenoxyethyl acrylate.

The polyepoxide mixture contained 56 percent of the diglycidyl ether of bisphenol A, having an EEW of 172–176 sold commercially as DER 332, plus 44 percent of the epoxycyclohexyl methyl epoxycyclohexane carboxylate, sold commercially as ERL 4221.

The catalysts employed were diethoxyacetophenone (DEAP) and p-t-butylphenyl iodonium hexafluorophosphate (IFP).

The compositions were prepared by blending 40 parts acrylic interpolymer mixture with 1.2 parts DEAP and mixing that 41.2 parts with 58.35 parts of a blend consisting of 55.6 parts polyepoxide mixture and 2.75 parts IFP.

The compositions were coated on Bonderite 37 panels and drawn down to 0.35 mil (0.009 mm) with a No. 14 Meyer wire wound rod.

The coated panels were subjected to ultraviolet radiation as in Example 1 and cured to a tack-free state in three passes.

When tested for reverse impact with a Gardner Reverse Impact Tester, the coatings passed 100-inch pounds (115.2 centimeter-kilograms).

The panels showed 100 percent adhesion both with no post bake and after a two minute post bake at 400° F. (204.4° C.).

In contrast, when the procedure was repeated using only the polyepoxide mixture and IFP catalyst, the film wrinkled badly and cured improperly.

When the blend of polyepoxide and IFP was drawn down with a No. 4 Meyer wire wound rod to a coating of 0.1 mil (0.0025 mm), the coating cured normally.

Example 5

A composition similar to that of Example 4 was prepared. The acrylic interpolymer mixture was the same as that of that example.

The polyepoxide mixture was a blend of 10 parts ERL 4221 and 12.5 parts of the diglycidyl ether of bisphenol A having an EEW of 182–190 and sold commercially as DER 332.

The catalyst, sold commercially as 3M FC-503, was a solution of a triarylsulfonium hexafluorophosphate (SFP) in a blend of a polyglycol and liquid epoxy resin.

The composition was prepared by blending 75 parts of the acrylic interpolymer mixture with 2.25 parts diethoxyacetophenone and mixing that 77.2 parts with 25 parts of a blend consisting of 22.5 parts of polyepoxide mixture and 2.5 parts SFP.

When Bonderite 37 panels were coated, drawn down and subjected to ultraviolet radiation as in Example 4, the coating cured to a tack-free state in two passes.

The coating passed 100-inch pounds (115.2 centimeter-kilograms) when tested for reverse impact.

The coating showed 30 percent adhesion with no post bake and 100 percent adhesion after a post bake for two minutes at 400° F. (204.4° C.).

In contrast, a composition consisting of 90 parts of the polyepoxide mixture and 10 parts of 3M FC-503 was coated on panels as above, drawn down and cured to a tack-free state in two passes. The coatings failed at 10-inch pounds (11.5 centimeter-kilograms) when tested for reverse impact and showed 100 percent adhesion both with no post bake and after two minutes at 400° F. (204.4° C.) post bake.

Example 6

Several compositions were prepared from various acrylic interpolymer mixtures and polyepoxide mixtures.

In Sample A, not within the scope of this invention, the acrylic interpolymer mixture consisted of 27.5 parts of a diglycidyl ether of bisphenol A having an EEW of 177–188 and sold commercially as DER 330 plus 22.5 parts of 2-phenoxyethyl acrylate.

The polyepoxide mixture consisted of 30 parts ERL 4221 and 7.5 parts DER 332.

The catalyst was similar to that of Example 4 and is sold commercially as 3M FC-504.

No free radical photoinitiator was used.

In Sample B the acrylic interpolymer mixture consisted of 30 parts of the diacrylate of DER 330 and 20 parts of 2-phenoxyethyl acrylate.

The polyepoxide mixture consisted of 25 parts ERL 4221 and 20 parts of an epoxidized soybean oil sold commercially as Plastolein 9232.

The ionic catalyst precursor was 3M FC-503.

In Sample C the acrylic interpolymer mixture consisted of 25 parts of the diester of DER 331 with the half ester of hydroxyethyl acrylate and phthalic anhydride plus 25 parts of 2-phenoxyethyl acrylate.

The polyepoxide mixture consisted of 30 parts ERL 4221 plus 7.5 parts DER 332 plus 2.5 parts of the diglycidyl ether of 1,4-butanediol.

The ionic catalyst precursor was 3M FC-504.

In Sample D the acrylic interpolymer mixture consisted of 17.7 parts of the diacrylate of DER 330 plus 12.3 parts of the diacrylate of bisphenol A and 4 moles ethylene oxide plus 20 parts 2-phenoxyethyl acrylate.

The polyepoxide mixture consisted of 25 parts ERL 4221 plus 20 parts Plastolein 9232.

The ionic catalyst precursor was 3M FC-503.

In Sample E the acrylic interpolymer mixture consisted of 15.1 parts of the diacrylate of DER 330 plus 18.4 parts of the acrylate of the reaction product of glycerol, ethylene oxide and propylene oxide reacted to a molecular weight of 3000 plus 16.5 parts of 2-phenoxyethyl acrylate.

The polyepoxide mixture consisted of 20 parts ERL 4221 plus 25 parts DER 331.

The ionic catalyst precursor was 3M FC-503.

In each of the Samples B through E the free radical photoinitiator was diethoxyacetophenone.

Coating compositions were prepared by blending the acrylic interpolymer mixture with the diethoxyacetophenone and mixing that blend with a mixture of the polyepoxide mixture and ionic catalyst precursor. The compositions were applied to Bonderite 37 panels and to Parker aluminum panels. All coatings were drawn down with a No. 14 Meyer wire wound rod. The coatings were exposed to ultraviolet light radiations as in the previous examples. The coatings on the Bonderite panels were tested for reverse impact strength. The coatings on the Parker aluminum panels were tested for adhesion. The results are listed in the following table.

| Sample | Parts Acrylic Interpolymer | Parts Polyepoxide | Parts Diethoxy-Acetophenone | Parts Ionic Catalyst Precursor | Passes to Tack Free | Reverse Impact In-Lbs. | Adhesion No Bake | 2 Mins. 400° F. |
|---|---|---|---|---|---|---|---|---|
| A | 50 | 40 | — | 10 | 4 | 80 (92.2 cm-kg) | 0 | 20 |
| B | 50 | 45 | 1.5 | 5 | 2 | 80 | 50-70 | 100 |
| C | 50 | 40 | 1.5 | 10 | 3 | 100 (115.2 cm-kg) | 100 | 100 |
| D | 50 | 45 | 1.5 | 5 | 4 | 120 (138.2 cm-kg) | 100 | 100 |
| E | 50 | 45 | 1.5 | 5 | 2 | 110 (126.7 cm-kg) | 100 | 100 |

Example 7

The resin of Example 1 containing 50 percent acrylate and 50 percent epoxide functionality was blended in a 1 to 1 ratio with dicyclopentadiene acrylate. A formulation was prepared consisting of 97 percent of that resin blend, 1.1 percent of triphenyl sulfonium hexafluorophosphate, and 1.9 percent of acetonitrile.

To separate samples of that formulation were added various sensitizers. The compositions were coated on Parker aluminum panels. The cure response and adhesion were determined by the procedures described in the previous examples. The results are listed below.

| Sensitizer | Wgt % | Passes to Tack-Free State | Adhesion to Aluminum Panels (%) (Each of Two Samples) |
|---|---|---|---|
| None | — | 28 | 100,90 |
| 9,10-diphenylanthracene | 0.9 | 20 | 90,95 |
| 9-butylanthracene | 0.6 | 7 | 100,100 |

What is claimed is:

1. A photocurable resin composition comprising (A) a partially esterified epoxyester of a terminally unsaturated monocarboxylic acid and a polyepoxide, (B) a curing system consisting essentially of (1) a free radical photoinitiator and (2) a radiation sensitive aromatic onium salt of an element of Group Va or VIIa, said onium salt capable of inducing the cure of (A) by releasing a Lewis acid catalyst when exposed to radiant energy.

2. The resin composition of claim 1 wherein said epoxyester is a polyepoxide having from 10 to 90 percent of its oxirane groups esterified with said monocarboxylic acid.

3. The resin composition of claim 1 wherein said epoxyester is the reaction product of a diglycidyl ether and acrylic acid.

4. The resin composition of claim 3 wherein said diglycidyl ether is a digylcidyl ether of a polyhydric phenol.

5. The resin composition of claim 4 wherein said polyhydric phenol is bisphenol A.

6. The resin composition of claim 1 wherein said epoxyester is the reaction product of a diglycidyl ether and a hydroxyalkyl acrylate ester of a dicarboxylic acid.

7. The resin composition of claim 1 wherein said curing system is p-tertiarybutyl-α,α,α-trichloroacetophenone.

* * * * *

UNITED STATES PATENT AND TRADEMARK OFFICE
CERTIFICATE OF CORRECTION

PATENT NO. : 4,428,807

DATED : January 31, 1984

INVENTOR(S) : George A. Lee and Richard A. Hickner

It is certified that error appears in the above—identified patent and that said Letters Patent is hereby corrected as shown below:

Title Page, last line of type, "36 Claims, No Drawings" should read -- 7 Claims, No Drawings --.

Column 4, line 10, "bis[3,4-epoxy-6-methylcyclohexyl)methyl-" should read -- bis[(3,4-epoxy-6-methylcyclohexyl)methyl- --.

Column 7, line 50, "3,981,897 and various reference" should read -- 3,981,897 and various references --.

Column 14, Claim 4, line 2, "digylcidyl" should read -- diglycidyl --.

Signed and Sealed this

Second Day of October 1984

[SEAL]

Attest:

Attesting Officer

GERALD J. MOSSINGHOFF

Commissioner of Patents and Trademarks